(12) United States Patent
Hoefler et al.

(10) Patent No.: US 6,713,812 B1
(45) Date of Patent: Mar. 30, 2004

(54) NON-VOLATILE MEMORY DEVICE HAVING AN ANTI-PUNCH THROUGH (APT) REGION

(75) Inventors: Alexander B. Hoefler, Austin, TX (US); Gowrishankar L. Chindalore, Austin, TX (US); Paul A. Ingersoll, Austin, TX (US); Craig T. Swift, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/267,199

(22) Filed: Oct. 9, 2002

(51) Int. Cl.⁷ .................. H01L 29/788; H01L 29/76; H01L 29/94; H01L 31/082; H01L 31/113
(52) U.S. Cl. .................. 257/316; 257/323; 257/408; 257/409
(58) Field of Search .................. 257/315, 316, 257/323, 408, 409

(56) References Cited

U.S. PATENT DOCUMENTS

| | | | |
|---|---|---|---|
| 5,468,981 A | | 11/1995 | Hsu |
| 5,751,631 A | * | 5/1998 | Liu et al. ............... 365/185.01 |
| 5,773,863 A | | 6/1998 | Burr et al. |
| 5,923,987 A | | 7/1999 | Burr |
| 5,985,727 A | | 11/1999 | Burr |
| 6,060,742 A | * | 5/2000 | Chi et al. ............... 257/316 |
| 6,093,951 A | | 7/2000 | Burr |
| 6,111,286 A | * | 8/2000 | Chi et al. ............... 257/315 |
| 6,372,587 B1 | | 4/2002 | Cheek et al. |
| 6,384,457 B2 | | 5/2002 | Tyagi et al. |

* cited by examiner

Primary Examiner—Ngân V. Ngô
(74) Attorney, Agent, or Firm—Joanna G. Chiu; James L. Clingan, Jr.

(57) ABSTRACT

A memory device (70) that uses a non-volatile storage element (38), such as nitride, has reduced read disturb, which is the problem of tending to increase the threshold voltage of a memory device (70) during a read. To reduce this effect, the memory device (70) uses a counterdoped channel (86) to lower the natural threshold voltage of the device (70). This counterdoping can even be of sufficient dosage to reverse the conductivity type of the channel (86) and causing a negative natural threshold voltage. This allows for a lower gate voltage during read to reduce the adverse effect of performing a read. An anti-punch through (ATP) region (74) below the channel (86) allows for the lightly doped or reversed conductivity type channel (86) to avoid short channel leakage. A halo implant (46) on the drain side (54, 53) assists in hot carrier injection (HCI) so that the HCI is effective even though the channel (86) is lightly doped or of reversed conductivity type.

21 Claims, 4 Drawing Sheets

NON-VOLATILE MEMORY DEVICE HAVING AN ANTI-PUNCH THROUGH (APT) REGION

RELATED APPLICATIONS

This is related to U.S. patent application Ser. No. 10/267, 153 by Chindalore et al., filed on even date, and entitled "Non-Volatile Memory Device and Method for Forming."

FIELD OF THE INVENTION

This invention relates generally to semiconductor devices, and more specifically, to semiconductor devices for use in memory cells.

BACKGROUND OF THE INVENTION

In SONOS (silicon-oxide-nitride-oxide-silicon) based non-volatile memory (NVM) cells, hot-carrier electron injection (HCI) into the nitride may be used to program a memory cell having a high threshold voltage (Vt) state and a low Vt state. Efficient HCI programming requires high channel region doping and a sharp drain junction; however, read disturb is aggravated by having high channel region doping. That is, the repeated reading of a memory cell in the low Vt state continuously increases the Vt of the memory cell. The Vt may increase to a point where the state of the memory cell may change from a low Vt state to a high Vt state, thus resulting in a reliability failure of the memory cell. Therefore, a need exists for a memory cell with increased reliability during repeated reads.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment of the present invention, a semiconductor device which may be used as a NVM memory cell is formed having an anti-punch through (APT) region and an optional drain side highly doped region (halo). The halo region, if present, results in an increased dopant gradient between a channel region and a drain region of the semiconductor device. The APT region allows for the channel region to have a relatively low dopant concentration or be counter doped with respect to the APT region which minimizes read disturb (i.e. threshold voltage drift during a read cycle) by lowering the natural Vt. Therefore, use of the halo region and APT regions allows for efficient hot carrier injection programming of the semiconductor device to be maintained while reducing the read disturb.

Figure 1:
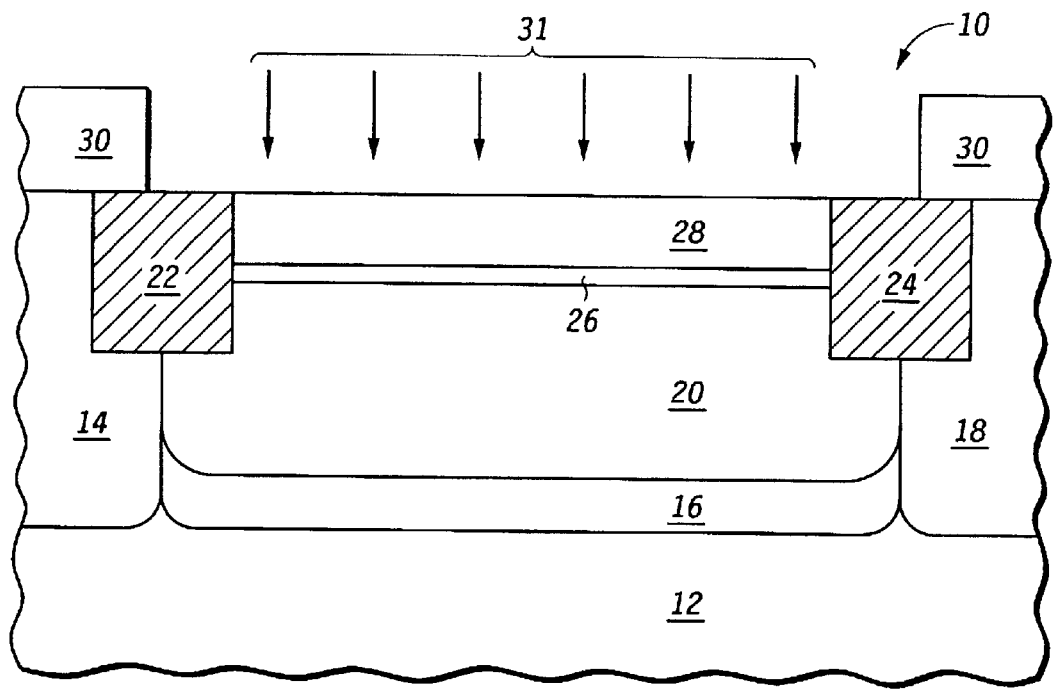
FIG. 1 illustrates a cross-sectional view of a semiconductor substrate having well implants and channel implants formed therein in accordance with an embodiment of the present invention.

FIG. 1 illustrates a semiconductor device 10 including a semiconductor substrate 12 having isolation trenches 22 and 24, surrounding N-type wells 14 and 18, isolating N-type well 16 between isolation trenches 22 and 24, and a masking layer 30. Note that the formation of isolation trenches 22 and 24, surrounding N-type wells 14 and 18, isolating N-type well 16, and masking layer 30 are known in the art and will only briefly be described herein. Isolation trenches 22 and 24 are formed in substrate 12, and afterwards, surrounding N-type wells 14 and 18 are formed. Isolation trenches 22 and 24 may include any type of insulating material, such as, for example, oxide, nitride, etc., or any combination thereof. After formation of surrounding N-type wells 14 and 18, a patterned masking layer 30 is used to define an opening between isolation trenches 22 and 24. Note that patterned masking layer 30 can be any type of masking layer, such as, for example, a photo resist layer, a hard mask, etc. Isolating N-type well 16 is then formed within substrate 12. After formation of isolating N-type well 16, an isolated P-type well 20 is formed within isolating N-type well 16, such that P-type well 20 is isolated from substrate 12.

After formation of isolated P-type well 20, an anti-punch through (APT) region 26 and channel region 28 are formed between isolation trenches 22 and 24. (Note that APT region 26 and channel region 28 may be formed in any order.) Channel region 28 and APT region 26 are formed such that channel region 28 is located between a top surface of substrate 12 and APT region 26, and APT region 26 is located between channel region 28 and isolated P-type well 20. (Note that APT region 26 may also be referred to as highly doped region 26.) A dopant used in the formation of APT region 26 is chosen such that it does not significantly diffuse into channel region 28. Arrows 31 illustrate that the dopant is applied uniformly to substrate 12. The direction of the implant for both APT region 26 and channel region 28 is substantially perpendicular to substrate 12. That is, the direction is no greater than approximately 10 degrees from vertical. Also note that the dopant concentration of APT region 26 is greater than the dopant concentration of isolated P-type well 20.

In one embodiment, APT region 26 and channel region 28 are formed such that the dopant concentration of channel region 28 is less than the dopant concentration of APT region 26. In one embodiment, APT region 26 and channel region 28 are formed using P-type dopants, such as, for example, boron or indium. In this embodiment, the dopant concentration of channel region 28 may be ten to fifty times lower than the dopant concentration of APT region 26. APT region 26 may therefore be implanted with an energy in a range of approximately 30 to 50 kilo electron-volts (keV) and a dosage in a range of approximately $1\times10^{12}/cm^2$ to $1\times10^{14}/cm^2$, and channel region 28 may be implanted with an energy in a range of approximately 5 to 30 keV and a dosage in a range of approximately $1\times10^{11}/cm^2$ to $1\times10^{13}/cm^2$. Note that in one embodiment, different P-type dopants may be used for channel region 28 and APT region 26, such as, for example, boron for channel region 28 and indium for APT region 26. Alternatively, a same P-type dopant may be used for both regions.

In the illustrated embodiment, the semiconductor substrate 12 is a bulk substrate. In this embodiment, substrate 12 is a semiconductor-containing substrate and may include silicon, gallium arsenide, silicon germanium, etc., or any combination thereof. Alternatively, substrate 12 may be a silicon on insulator (SOI) substrate (not shown) having a bottom semiconductor layer, a buried insulating layer overlying the bottom semiconductor layer, and a top semiconductor layer. In this embodiment, note that surrounding N-type wells 14 and 18 and isolating N-type well 16 are not needed. That is, isolated P-type well 20 would correspond to the top semiconductor layer of the SOI substrate. In this embodiment, buried insulating layer can be a silicon oxide layer and top and bottom semiconductor layers may be formed of silicon, germanium, gallium arsenide, or the like.

Figure 2:
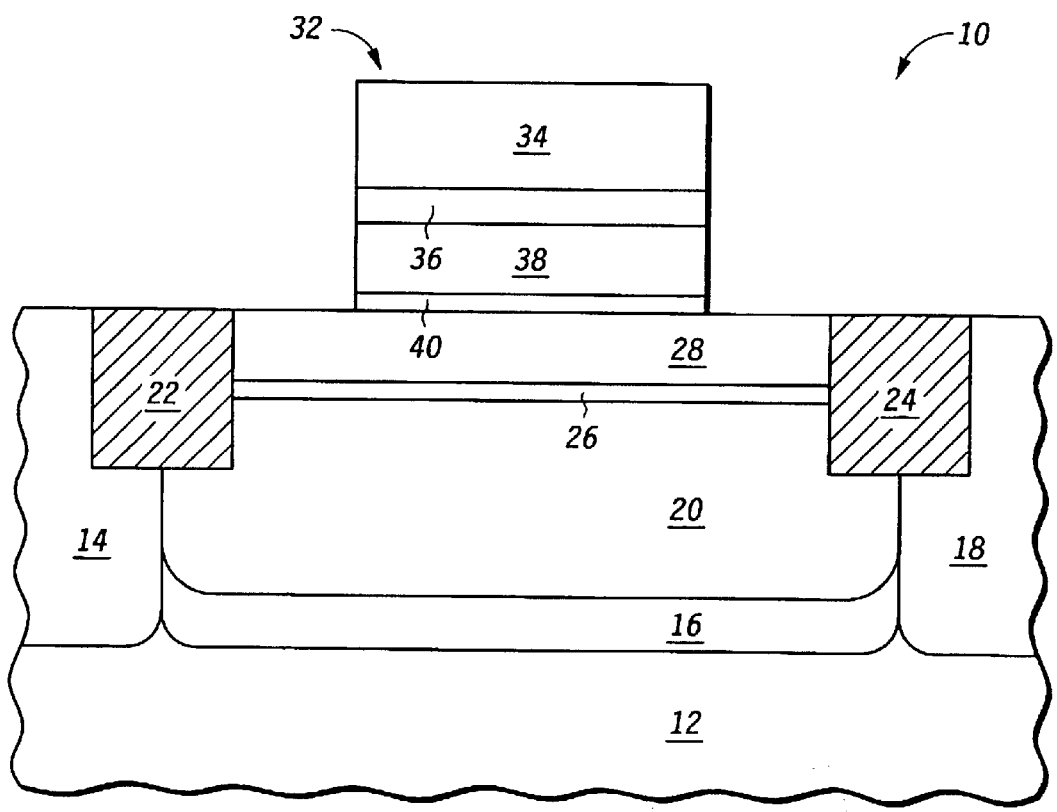
FIG. 2 illustrates a cross-sectional in view of the semiconductor substrate of FIG. 1 having a gate stack formed over the semiconductor substrate in accordance with an embodiment of the present invention.

FIG. 2 illustrates semiconductor device 10 after removal of masking layer 30 and formation of a SONOS gate stack 32 over channel region 28, between isolation wells 22 and 24, where SONOS gate stack 32 includes a first oxide 40 formed over channel region 28, a nitride 38 formed over first oxide 40, a second oxide 36 formed over nitride 38, and a gate 34 formed over second 25 oxide 36. (Note that first oxide 40, nitride 38, and second oxide 36 may be referred to as an oxide-nitride-oxide structure.) Masking layer 30 can be removed using conventional processing. In forming gate stack 32, a first oxide layer is blanket deposited or grown over semiconductor substrate 12 using chemical vapor deposition (CVD) or a thermal oxidation process, respectively. Alternatively, the first oxide layer may be formed by physical vapor deposition (PVD), atomic layer deposition (ALD), thermal oxidation, the like or combinations of the above. Then, a nitride layer is deposited over the first oxide layer. The nitride layer may formed by CVD, PVD, ALD, the like or combinations thereof. A second oxide layer is blanket deposited on the nitride layer using chemical vapor deposition (CVD) or a thermal oxidation process, respectively. Alternatively, the second oxide layer may be formed by physical vapor deposition (PVD), atomic layer deposition (ALD), thermal oxidation, the like or combinations of the above. A gate layer is blanket deposited over the second oxide layer formed by CVD, PVD, ALD, the like or combinations thereof. Using conventional masking and etch processes, the first oxide layer, nitride layer, second oxide layer, and gate layer may then be patterned and etched to form the resulting gate stack 32. (Note than in alternate embodiments, each layer of the stack may be patterned and etched individually to form the resulting gate stack 32.) In one embodiment, the resulting gate stack 32 (and likewise, the portion of channel region 28 below gate stack 32) has a length in a range of approximately of 0.35 microns to 0.06 microns.

Gate 34 of gate stack 32 may be any conductive material, such as polysilicon or a metal-containing material, and may be referred to as a control gate. First oxide 40 and second oxide 36 can be any dielectric, such as, for example, an insulating material or stack of insulating materials, such as, for example, silicon oxide, oxynitride, metal-oxide, nitride, etc., or any combination thereof. Nitride 38 may be a silicon nitride, oxynitride, or any other material known to have charge traps such that the charges can be stored therein. Therefore first oxide 40 and second oxide 36 may also be referred to as first and second insulating layers, respectively, or bottom and top dielectrics, respectively, and nitride 38 may be referred to as a charge storing layer, a storage element, or a dielectric.

Although gate stack 32 is illustrated as a SONOS stack, in alternate embodiments, gate stack 32 may be any type of NVM gate stack. For example, gate stack 32 may be replaced by a floating gate stack (not shown) having a tunnel dielectric formed over channel region 28, between isolation trenches 22 and 24, a floating gate formed over the tunnel dielectric, a control dielectric formed over the floating gate, and a control gate over the control dielectric. In forming the floating gate stack, a tunnel dielectric layer is formed overlying semiconductor substrate 12 by CVD, PVD, ALD, thermal oxidation, the like, or combination thereof. The tunnel dielectric layer can be any insulating material, such as an oxide (e.g. silicon dioxide), a nitride, an oxynitride, metal oxide, etc. The tunnel dielectric layer is then patterned and etched using conventional processing to form the tunnel dielectric of the floating gate stack overlying channel region 28 (where the tunnel dielectric is located in a similar location as oxide 40 of gate stack 32 illustrated in FIG. 2).

A floating gate layer is then formed over the semiconductor substrate 12 and the tunnel dielectric by CVD, PVD, ALD, the like, or combinations thereof. In one embodiment, the floating gate layer may be any conductive material, such as polysilicon, metal, or the like. In yet another embodiment, floating gate layer may be a plurality of nanocrystals (i.e. discrete storage elements) such as in a nanocrystal NVM device. The floating gate layer is then patterned and etched using conventional processing to form the floating gate of the floating gate stack overlying the tunnel dielectric.

Figure 3:
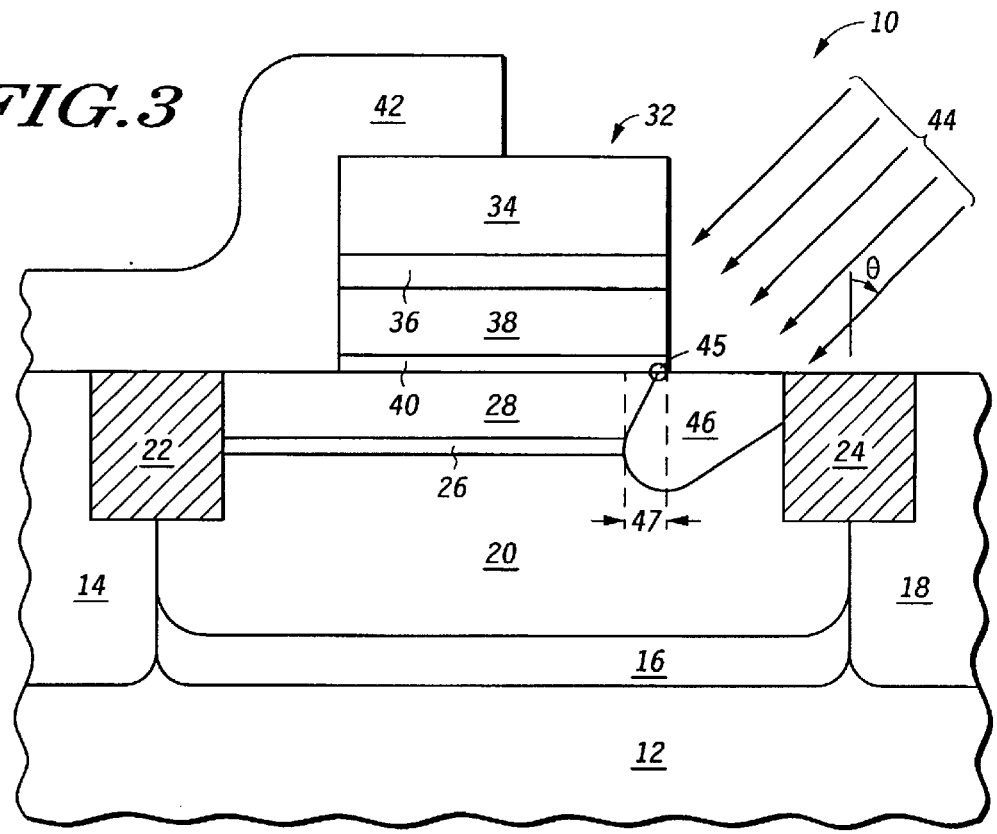
FIG. 3 illustrates a cross-sectional view of the gate stack of FIG. 2 after formation of a halo implant in accordance with an embodiment of the present invention.

A control dielectric layer is then formed over the semiconductor substrate 12 and the floating gate by CVD, PVD, ALD, thermal oxidation, the like, or combinations thereof. The control dielectric layer is then patterned and etched using conventional processing to form the control dielectric of the floating gate stack overlying the floating gate. Note that the control dielectric is optional and may not be formed in all floating gate devices. If present, the control dielectric layer can be any insulating material, such as an oxide (e.g. silicon dioxide), nitride, metal oxide, high dielectric constant material (i.e. a material having a dielectric constant of greater than approximately 4 and less than approximately 15), the like, or combinations thereof. A control gate layer is then formed over the semiconductor substrate 12 and the control dielectric by CVD, PVD, ALD, the like, or combinations thereof. Control gate layer may be any conductive material, such as polysilicon or a metal-containing material. Using conventional masking and etch processes, the control gate layer is patterned and etched to form the control gate of the floating gate stack overlying the control dielectric. (Note that in alternate embodiments, rather than patterning and etching each layer of the floating stack separately, combination of layers or all the layers may be patterned and etched using a same pattern and etch process in order to reduce processing steps required to form the resulting floating gate stack.) Referring now to FIG. 3, a patterned masking layer 42 is formed using conventional masking processes. Note that masking layer 42 can be any type of masking layer, such as, for example, photo resist or a hard mask. Patterned asking layer 42 (also referred to as an implant mask) masks a source side of semiconductor device 10 (at a first side of gate stack 32, in which a source region will later be formed) while exposing a drain side of semiconductor device 10 (at a second side of gate stack 32, opposite the first side, in which a drain region will later be formed). As illustrated in FIG. 3, an angled implant 44 is used to form a halo region 46 which extends beneath gate stack 32 by a distance 47 as measured from a first edge of gate stack 32. In one embodiment, distance 47 is at most approximately 500 Angstroms. Angled implant 44 has a corresponding angle of implant θ, where θ is measured from vertical. In one embodiment, θ is in a range of approximately 20 to 60 degrees, and more preferably, approximately 30 to 40 degrees. The angle of implant 44 is therefore sufficient to increase the dopant concentration in halo region 46 at a region 45 beneath gate stack 32 such that it is greater than the dopant concentration of channel region 28. In one embodiment, halo region 46 is implanted using a P-type dopant, such as, for example, boron or indium, at an energy in a range of approximately 10 to 50 keV having a dosage in a range of approximately $1\times10^{12}/cm^2$ to $1\times10^{14}/cm^2$. (Note that alternatively, halo region 46 may be referred to as angled halo 46 or as a highly or heavily doped region 46. Also, the dopant concentration of halo region 46 is generally greater than the dopant concentration of isolated P-type well 20.)

Figure 4:
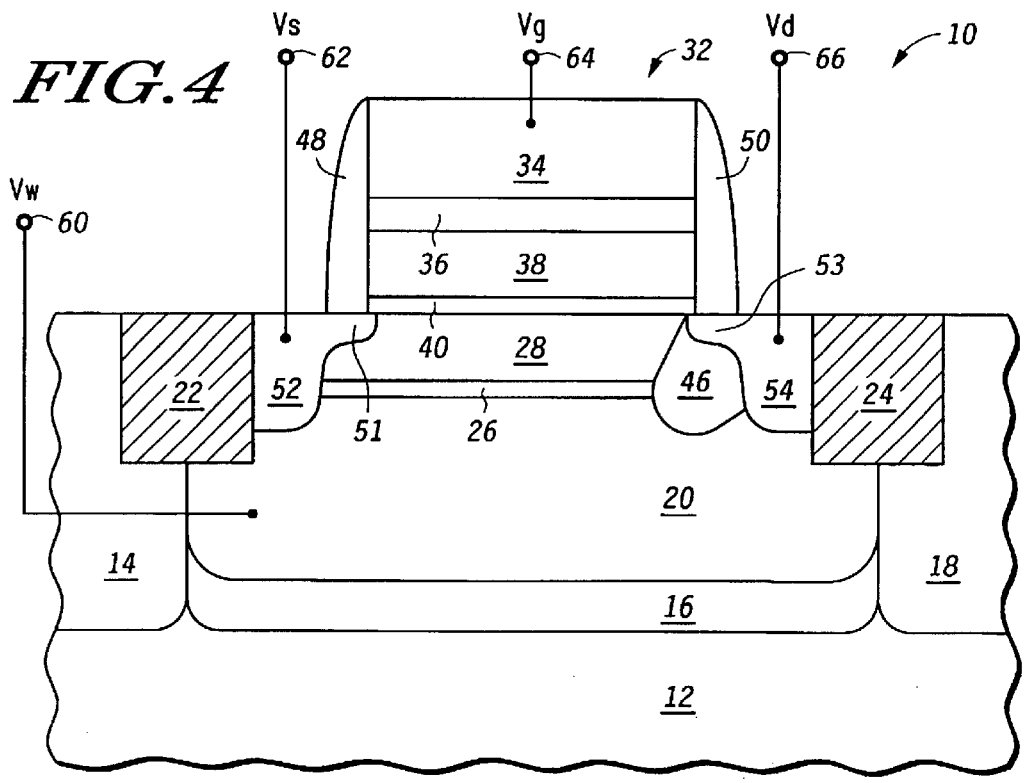
FIG. 4 illustrates the semiconductor device of FIG. 3 after forming source and drain regions and extension regions within the semiconductor substrate and sidewall spacers along the sidewalls of the gate stack in accordance with an embodiment of the present invention.

FIG. 4 illustrates semiconductor device 10 after removal of masking layer 42 and the formation of sidewall spacers 48 and 50, source and drain extensions 51 and 53, and source and drain regions 52 and 54. Masking layer 42 can be removed using conventional processing steps. After removal of masking layer 42, source extension 51 and drain extension 53 are formed using conventional masking and implanting processes. Note that extensions 51 and 53 extend into channel region 28 and each underlie a portion of gate stack 32. In one embodiment, an N-type dopant, such as arsenic, phosphorous, or antimony, is implanted at an energy in a range of approximately 30 to 70 keV having a dosage in a range of approximately $1\times10^{14}/cm^2$ to $1\times10^{15}/cm^2$ to form extensions 51 and 53. Drain extension 53 is formed such that it does not extend beyond halo region 46. Note that after formation of drain extension 53, an increasing dopant gradient results from channel region 28 to drain extension 53. Although an increasing dopant gradient exists from channel region 28 to drain extension 53 without halo region 46, the presence of halo region 46 further increases this dopant gradient. Also, the presence of halo region 46 allows for a relatively low dopant concentration within channel region 28.

After formation of extensions 51 and 53, spacers 48 and 50 are formed along the sidewalls of gate stack 32 using conventional processing steps. These spacers, for example, may include any insulating material, such as, for example, oxide or nitride. Alternatively, spacers 48 and 50 may not be present. If spacers 48 and 50 are not present, then source and drain regions 52 and 54 may not be formed such that extensions 51 and 53 are used as the source and drain regions, respectively. However, with the presence of spacers 48 and 50, source and drain regions may be formed using another implant step. In one embodiment, an N-type dopant, such as arsenic, phosphorous, or antimony, is implanted at an energy in a range of approximately 10 to 30 keV having a dosage in a range of approximately $1\times10^{15}/cm^2$ to $5\times10^{16}/cm^2$ to form source region 52 and drain region 54. Note that drain and source regions 52 and 54 do not extend below isolation trenches 22 and 24. Note also that the depth of APT 26 is selected such that it does not extend below the depth of source and drain regions 52 and 54. Although not shown, further conventional processing may be used to complete semiconductor device 10. For example, contacts may be formed to the source region 52, gate 34, drain region 54, and isolated P-type well 20. Also, other semiconductor device levels may be formed underneath or above semiconductor device 10.

As illustrated in FIG. 4, Vw 60 corresponds to the voltage applied to isolated P-type well 20, Vs 62 corresponds to the voltage applied to source region 52, Vg 64 corresponds to the voltage applied to gate 34, and Vd 66 corresponds to the voltage applied to drain region 54. In the illustrated embodiment, semiconductor device 10 may be used as an NVM memory cell within an NVM memory (not shown). As used herein, a high Vt state corresponds to a program state of the memory cell, and a low Vt state corresponds to an erase state of the memory cell. (Note, however, that in alternate embodiments, the program and erase states may be reversed.) Semiconductor device 10 is erased by removing electrons from nitride 38 which results in semiconductor device 10 having a low Vt (such as, for example, below approximately 2 volts). Many known methods may be used to place semiconductor device 10 into a low Vt state, such as, for example, Fowler-Nordheim tunneling, hot hole injection, direct tunneling, etc.

Semiconductor device 10 is programmed by storing electrons within nitride 38 which results in semiconductor device 10 having a high Vt (such as, for example, above approximately 4 volts). Therefore, semiconductor device 10 may be programmed by applying a drain voltage (Vd) and a source voltage (Vs) where Vd is approximately 3 to 5 volts greater than Vs. For example, in one embodiment, a Vs of 1 volt and a Vd of 4 volts may be used. In this embodiment, a gate voltage (Vg) of approximately 5 to 10 volts and a well voltage (Vw) of approximately 0 to −3 volts is applied. During the programming of semiconductor device 10, having the above voltages applied, hot carriers are generated in the drain depletion region, some of which are injected through oxide 40 into nitride 38. This results in increasing the Vt of semiconductor device 10. Note that the dopant gradient that was created by halo region 46 and drain extension 53 amplifies this hot carrier injection thus maintaining efficient hot carrier programming of semiconductor device 10. This efficiency is maintained even with channel region 28 having a relatively low dopant concentration (approximately $1\times10^{16}/cm^3$ to $1\times10^{17}/cm^3$). Furthermore, the relatively low dopant concentration of channel region 28 reduces the natural Vt of semiconductor device 10 thereby improving the read disturb, as will be described below.

The natural Vt of semiconductor device 10 refers to the threshold voltage prior to placing any charge into nitride 38. For a higher natural Vt, the read disturb is degraded. (Note that as used herein, read disturb describes the gradual increase in threshold voltage (Vt) as the low Vt memory cell is continuously read, i.e. the threshold voltage drift during a read cycle.) Therefore, as the natural Vt increases, the time to failure of the memory cell decreases. That is, as natural Vt increases, a smaller number of reads to the memory cell results in failure due to the drift from a low Vt to a high Vt. Therefore, by decreasing the natural Vt, read disturb of the low Vt state is improved (i.e. threshold voltage drift is reduced). For example, referring back to FIG. 4, a read of semiconductor device 10 may be performed by applying a Vd that is approximately 0.5 to 1.5 volts greater than Vs. For example, in one embodiment, Vs may be 0 volts and Vd may be 1 volt. In this embodiment, a Vg and Vw sufficient to produce approximately 10 to 30 microamperes of current in channel region 28 is applied. For example, in one embodiment, a Vg of 2 volts and a Vw of 0 volts may be used. (Note that the voltages provided in this example or given in reference to the source voltage (Vs). That is, in this example, if Vs is increased by 1 volt, Vd, Vg, and Vw are also increased by 1 volt.) During a read or access of erased semiconductor device 10 (i.e. semiconductor device 10 in a low Vt state), an inversion layer is formed in channel region 28 and a depletion region (not shown) is formed around drain region 54 and drain extension 53. This depletion region substantially masks the dopant gradient created in halo region 46 thereby preventing the higher dopant of halo region 46 from increasing the Vt of semiconductor 10. In this manner, the Vt remains in a low Vt state, thus improving the read disturb by reducing Vt drift.

For the length of gate stack 32 being in a range of approximately 0.35 to 0.06 microns as was described above, a short channel leakage may result during programming of semiconductor device 10. However, highly doped APT region 26 also functions to reduce this short channel leakage, thereby reducing power consumption and improving programming efficiency.

FIGS. 5–8 illustrates an alternate embodiment of the present invention where rather than forming channel region 28 and APT region 26 using dopants of the same conductivity type, two implant steps using dopants of different conductivity types may be used to form a channel region 86 and an APT region 74 instead. That is, in this alternate embodiment, channel region 28 and APT region 26 can be replaced with channel region 86 and APT region 74, respectively, which function in a similar manner to channel region 28 and APT region 26 described above to allow for efficient hot carrier injection programming of the semiconductor device while reducing the read disturb. Also, as will be described below, in this alternate embodiment, halo region 46 may not be present. (Note that in the following descriptions of FIGS. 5–8, reference numerals which are the same as reference numerals used in the description of FIGS. 1–4 indicate like or similar elements.)

Figure 5:
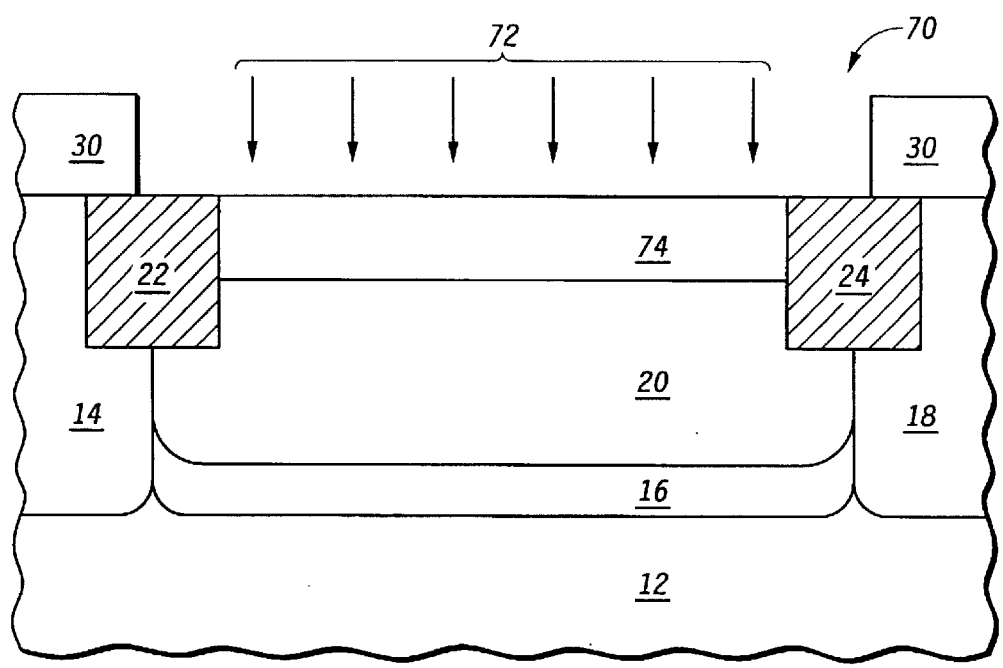
FIG. 5 illustrates a cross-sectional view of a semiconductor substrate having well implants formed therein in accordance with an alternate embodiment of the present invention.

FIG. 5 illustrates a semiconductor device 70 including a semiconductor substrate 12 having isolation trenches 22 and 24, surrounding N-type wells 14 and 18, isolating N-type well 16 between isolation trenches 22 and 24, and patterned masking layer 30. Note that the formation of isolation trenches 22 and 24, surrounding N-type wells 14 and 18, isolating N-type well 16, and masking layer 30 are the same as was described in reference to FIG. 1 above, and therefore will not be described again here in reference to FIG. 5. After formation of isolation trenches 22 and 24, surrounding N-type wells 14 and 18, patterned masking layer 30, isolating N-type well 16, and isolated P-type well 20 (where the same description, materials, and alternatives provided above in reference to FIG. 1 apply here in reference to FIG. 5), an APT region 74 is formed between isolation trenches 22 and 24 in isolated P-type well 20. (Note that APT region 74 may also be referred to as highly doped region 74.) Arrows 72 illustrate that the dopant is applied uniformly to substrate 12. The direction of the implant for APT region 74 is substantially perpendicular to substrate 12. That is, the direction is no greater than approximately 10 degrees from vertical. In one embodiment, APT region 74 is formed using a P-type dopant, such as, for example, boron or indium. For example, APT region 74 may be implanted with an energy in a range of approximately 30 to 50 keV and a dosage in a range of approximately $1 \times 10^{12}/cm^2$ to $1 \times 10^{14}/cm^2$. Also note that the dopant of APT region 74 and isolated P-type well 20 are of the same conductivity type and the dopant concentration of APT region 74 is greater than the dopant concentration of isolated P-type well 20. For example, in one embodiment, the dopant concentration of APT region 74 is approximately 2 to 100 times greater than the dopant concentration of isolated P-type well 20. For example, the dopant concentration of APT region 74 may be in a range of approximately $5 \times 10^{17} cm^{-3}$ to $5 \times 10^{18} cm^{-3}$, and the dopant concentration of isolated P-type well 20 may be in a range of approximately $5 \times 10^{16} cm^{-3}$ to $5 \times 10^{17} cm^{-3}$.

Figure 6:
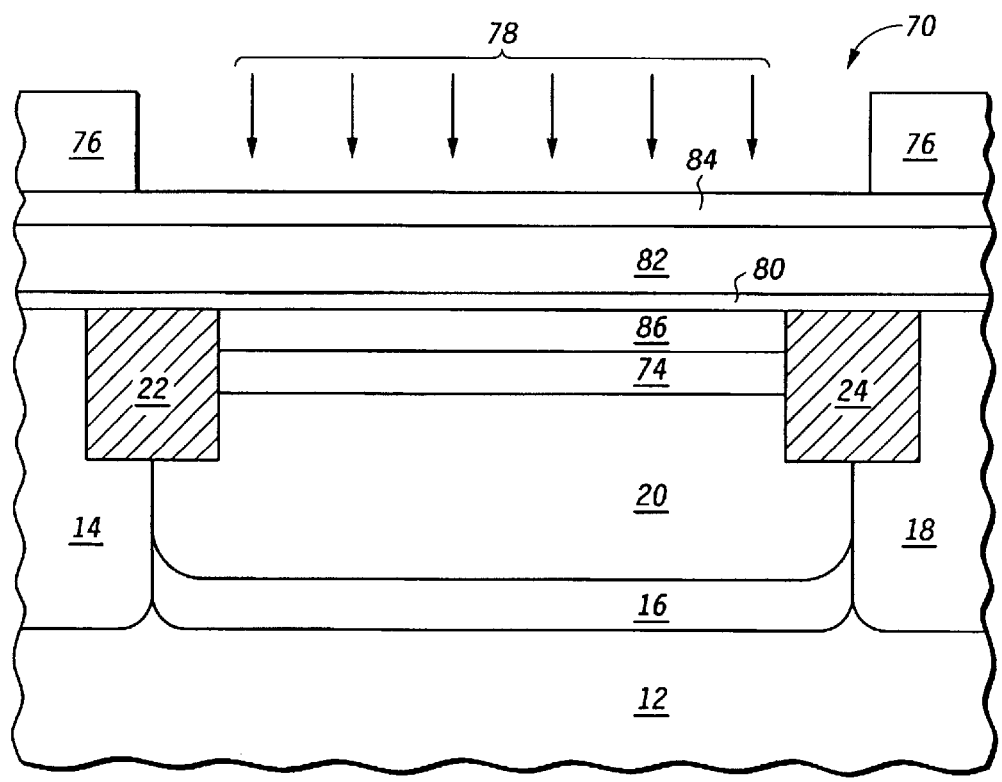
FIG. 6 illustrates a cross-sectional view of the semiconductor substrate of FIG. 5 having a first oxide layer, a nitride layer, and a second oxide layer formed over the semiconductor substrate and a channel implant in accordance with an embodiment of the present invention.

FIG. 6 illustrates semiconductor device 70 after removal of patterned masking layer 30 and formation of a first oxide layer 80, a nitride layer 82, and a second oxide layer 84. Note that masking layer can be removed as described above in reference to FIG. 2. In the illustrated embodiment, first oxide layer 80 is blanket deposited or grown over semiconductor substrate 12 using chemical vapor deposition (CVD) or a thermal oxidation process, respectively. Alternatively, the first oxide layer may be formed by physical vapor deposition (PVD), atomic layer deposition (ALD), thermal oxidation, the like or combinations of the above. Then, nitride layer 82 is deposited over first oxide layer 80. Nitride layer 82 may formed by CVD, PVD, ALD, the like or combinations thereof. Second oxide layer 84 is then blanket deposited over nitride layer 82 using chemical vapor deposition (CVD) or a thermal oxidation process, respectively. Alternatively, second oxide layer 84 may be formed by physical vapor deposition (PVD), atomic layer deposition (ALD), thermal oxidation, the like or combinations of the above.

After formation of second oxide layer 84, a patterned masking layer 76 is used to define an opening between isolation trenches 22 and 24. Note that patterned masking layer 76 can be any type of masking layer, such as, for example, a photo resist layer, a hard mask, etc. After formation of patterned masking layer 76, channel region 86 is formed in isolated P-type well 20. In one embodiment, channel region 86 is formed using an N-type dopant, such as, for example, arsenic, phosphorous, or antimony. This N-type dopant may be implanted with an energy in a range of approximately 5 to 70 keV and a dosage in a range of approximately $1 \times 10^{11}/cm^2$ to $5 \times 10^{13}/cm^2$. In the illustrated embodiment, N-type dopant compensates a portion of the existing P-type dopant of APT region 74 to form channel region 86. As a result, channel region 86 has a first conductivity type (such as N-type in this embodiment) and is located between a top surface of substrate 12 and APT region 74, and APT region 74 has a second conductivity type (such as P-type in this embodiment) and is located between channel region 86 and isolated P-type well 20. Note that in order for the N-type dopant to properly compensate the portion of APT region 74, the N-type dopant concentration in channel region 86 should be higher than the P-type dopant concentration in APT region 74.

After formation of channel region 86, the net doping concentration of channel region 86, in one embodiment, is in a range of approximately 0 to $5 \times 10^{18} cm^{-3}$. The net doping concentration, as used herein, refers to the absolute difference between dopants of one conductivity type and dopants of another conductivity type. For example, the net doping concentrations provided for channel region 86 refers to the absolute value of the difference between the P-type dopants of APT region 74 and N-type dopants of channel region 86.

In one embodiment of the present invention, the concentration of P-type dopants in channel region 86 minus the concentration of N-type dopants in channel region 86 is less than or equal to the net doping concentration in isolated P-type well 20. Note that the concentration of P-type dopants in channel region 86 minus the concentration of N-type dopants in channel region 86 may provide a negative number having an absolute value greater than the net doping concentration in isolated P-type well 20. In yet another embodiment of this invention, the concentration of P-type dopants in channel region 86 minus the concentration of N-type dopants in channel region 86 may provide a negative number having an absolute value less than the net doping concentration in isolated P-type well 20. In an alternative embodiment, it is possible to have a non-uniform well doping in the region below the APT region such that the APT doping concentration is less than the maximum value of the well concentration.

Note that as illustrated in FIG. 6, channel region 86 is formed after formation of first oxide layer 80, nitride layer 82, and second oxide layer 84. However, in alternate embodiments, channel region 86 may be formed prior to formation of these layers. That is, after formation of APT region 74 described in reference to FIG. 5, a subsequent implant step can be used to form channel region 86 using the same patterned masking layer 30. Therefore, in this embodiment, patterned masking layer 76 would not be needed.

Figure 7:
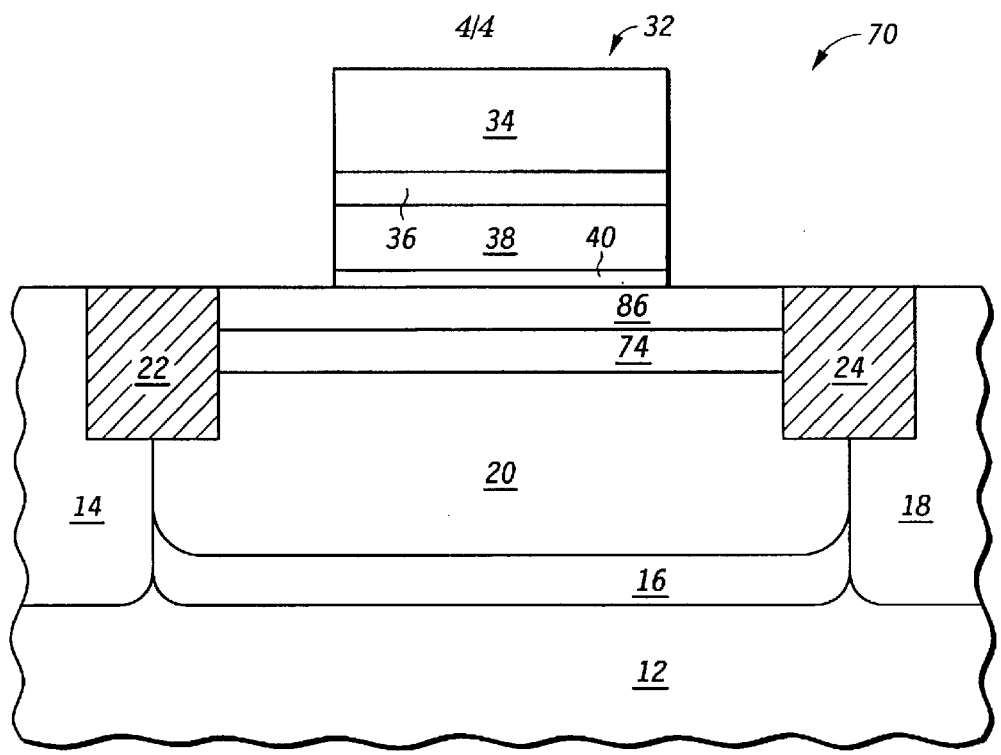
FIG. 7 illustrates a cross-sectional view of the semiconductor substrate of FIG. 6 after formation of a gate stack in accordance with an embodiment of the present invention.

FIG. 7 illustrates semiconductor device 70 after formation of gate stack 32. After formation of second oxide layer 84 overlying nitride layer 82, patterned masking layer 76 is removed (for example, using conventional processing). A gate layer is then blanket deposited over second oxide layer 84 formed by CVD, PVD, ALD, the like or combinations thereof. Using conventional masking and etch processes, first oxide layer 80, nitride layer 82, second oxide layer 84, and the gate layer may then be patterned and etched to form the resulting gate stack 32. That is, the etching of first oxide layer 80 results in first oxide 40, the etching of nitride layer 82 results in nitride 38, the etching of second oxide layer 84 results in second oxide 36, and the etching of the gate layer results in gate 34. (Note than in alternate embodiments, each layer of the stack may be patterned and etched individually to form the resulting gate stack 32. For example, oxide layers 80 and 84 and nitride layer 82 can be patterned and etched prior to formation of channel region 86.) In one embodiment, the resulting gate stack 32 (and likewise, the portion of channel region 86 below gate stack 32) has a length in a range of approximately of 0.35 microns to 0.06 microns. (Note that the descriptions, including materials and alternatives, provided above with respect to first oxide 40, nitride 36, second oxide 36, and gate 34 apply to gate stack 32 of FIG. 7 as well.)

Although gate stack 32 is illustrated as a SONOS stack in FIG. 7, in alternate embodiments, gate stack 32 may be any type of NVM gate stack, as was described above in reference to FIG. 3. Therefore, all the descriptions provided for gate stack 32 above apply to this embodiment as well. That is, all methods of formation, materials, and alternatives described above in reference to gate stack 32 of FIG. 3 apply again here to gate stack 32. For example, gate stack 32 may be replaced by a floating gate stack (not shown) as was described above. However, note that if gate stack 32 is replaced by a floating gate stack, the floating gate may be too thick to allow the proper penetration of implants for forming channel region 86. Therefore, in an embodiment using a floating gate stack, channel region 86 may be formed after forming APT region 74 and prior to forming any portion of the floating gate stack.

In one embodiment, after formation of gate stack 32, a halo region, such as halo region 46, may be formed in isolated P-type well 20 as was described above in reference to FIG. 3. That is, after formation of gate stack 32, patterned masking layer 42 may be used to form halo region 46, as was described above in reference to FIG. 3. In this embodiment, halo region 46 (not shown in FIGS. 7 and 8) would be adjacent to channel region 86 and APT region 74 (rather than channel region 28 and APT region 26). However, the same methods of formation, materials, and alternatives described for halo region 46 and angled implant 44 in reference to FIG. 3 can be applied to the current embodiment having channel region 86 and APT region 74 in place of channel region 28 and APT region 26. Note that in the current embodiment of FIGS. 5–8, halo region 46 may not be necessary due to the counter doping methods used to form channel region 86 and APT region 74.

Figure 8:
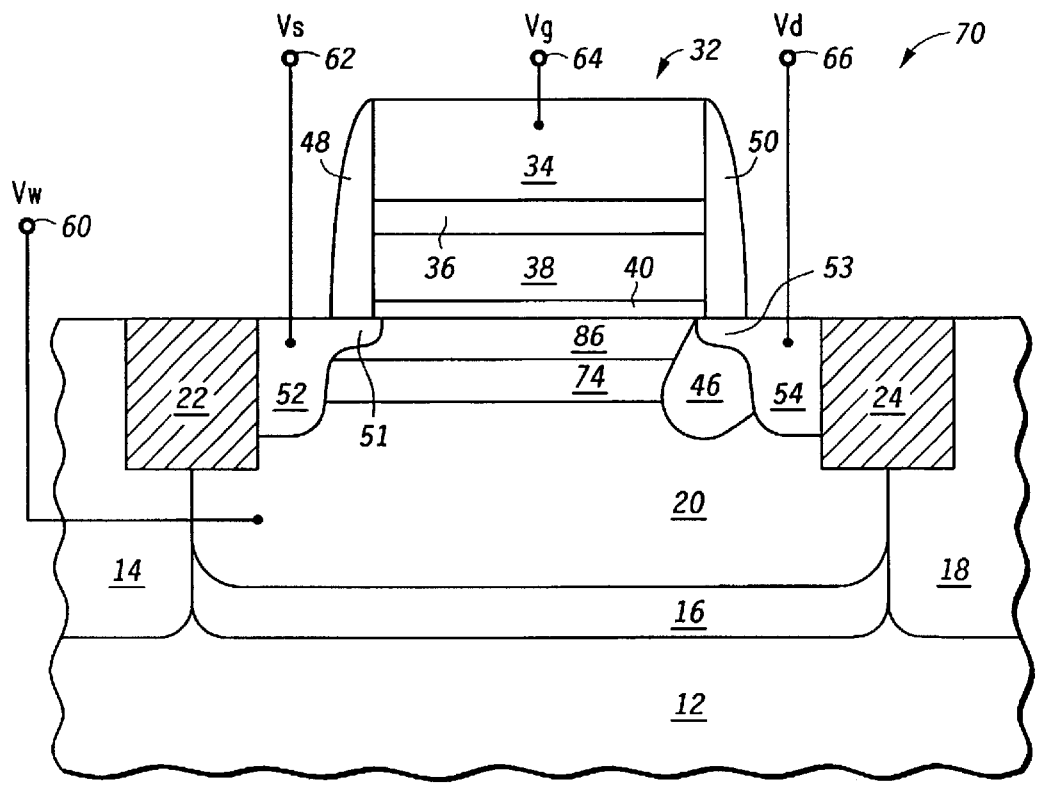
FIG. 8 illustrates the semiconductor device of FIG. 7 after forming source and drain regions and extension regions within the semiconductor substrate and sidewall spacers along the sidewalls of the gate stack in accordance with an embodiment of the present invention.

FIG. 8 illustrates semiconductor device 70 after removal of masking layer 76, formation of gate stack 32, formation of halo region 46, and the formation of sidewall spacers 48 and 50, source and drain extensions 51 and 53, and source and drain regions 52 and 54. Note that the same descriptions provided above for halo region 46, sidewall spacers 48 and 50, source and drain extensions 51 and 53, and source and drain regions 52 and 54 apply here in reference to FIG. 8. That is, the same methods of formation, materials, and alternatives described in reference to FIG. 4 apply to FIG. 8. Also note that in FIG. 8, halo region 46 is shown and hence, semiconductor device 70 of FIG. 8 is similar to semiconductor device 10 of FIG. 4, except that channel region 28 and APT region 26 of FIG. 4 is replaced with channel region 86 and APT region 74 such that halo region 46 is adjacent to channel region 86 and APT region 74. However, note that in alternate embodiments, halo region 46 may not be present. In this alternate embodiment, channel region 86 and APT region 74 would be adjacent to drain extension 53 and drain region 54.

As illustrated in FIG. 8 (similar to FIG.4), Vw 60 corresponds to the voltage applied to isolated P-type well 20, Vs 62 corresponds to the voltage applied to source region 52, Vg 64 corresponds to the voltage applied to gate 34, and Vd 66 corresponds to the voltage applied to drain region 54. In the illustrated embodiment, semiconductor device 70 may be used as an NVM memory cell within an NVM memory (not shown). As used herein, a high Vt state corresponds to a program state of the memory cell, and a low Vt state corresponds to an erase state of the memory cell. (Note, however, that in alternate embodiments, the program and erase states may be reversed.)

Program and erase operations for semiconductor device 70 are the same as described above with reference to semiconductor device 10 of FIG. 4. For example, during the programming of semiconductor device 70 using the voltages described above in reference to the programming of semiconductor device 10, hot carriers are generated in the drain depletion region, some of which are injected through oxide 40 into nitride 38. This results in increasing the Vt of semiconductor device 70. Note that if halo region 46 is present, the dopant gradient that is created by halo region 46 and drain extension 53 amplifies this hot carrier injection thus maintaining efficient hot carrier programming of semiconductor device 70. This efficiency is maintained even with channel region 86 being counter doped relative to APT region 74. Furthermore, the counter doping of channel region 86 reduces the natural Vt of semiconductor device 70 thereby improving the read disturb, as will be described below.

The natural Vt of semiconductor device 70 refers to the threshold voltage prior to placing any charge into nitride 38. As with semiconductor device 10, for a higher natural Vt of semiconductor device 70, the read disturb is degraded. Therefore, by decreasing the natural Vt, read disturb of the low Vt state is improved (i.e. threshold voltage drift is reduced). One of the ways that a lower natural Vt reduces read disturb is by enabling a lower Vt for the low Vt state. In order to form an inversion layer during a read of semiconductor device 70, the application of a gate bias (Vg) that exceeds the Vt of the low Vt state by a predetermined amount (typically referred to as gate overdrive) is necessary. The reduced Vt of the low Vt state (enabled by the counter doping of channel region 86), allows for the reduction of the absolute gate bias (Vg) during a read operation while maintaining a constant gate overdrive. A reduced absolute gate bias (Vg) reduces the electric field across gate stack 32 thus resulting in reduced read disturb.

If the reduced Vt of the low Vt state is too low (due to the counter doping of channel region 86), a source to drain leakage current can occur in unselected devices in a memory array containing semiconductor device 70. Unselected devices are those devices in the memory array which are not intended to be read during the read operation of semiconductor device 70. As known in the art, a reverse well to source bias increases the Vt of the low Vt state. Therefore the source to drain leakage current may be prevented by applying a reverse well to source bias to the unselected devices in the memory array during the read operation of semiconductor device 70. The reverse well to source bias should be sufficient to reduce the source to drain leakage current caused by the low Vt of the low Vt state. For example, referring back to FIG. 8, a read of semiconductor device 70 may be performed by applying a Vd that is approximately 0.5 to 1.5 volts greater than Vs. For example, in one embodiment, Vs may be 0 volts and Vd may be 1 volt. In this embodiment, a Vg and Vw sufficient to produce approximately 10 to 30 microamperes of current in channel region 28 is applied. For example, in one embodiment, a Vg in a range of approximately 1 to 2 volts and a Vw in a range of approximately 0 to −3 volts may be used. Note that the voltages provided in this example or given in reference to the source voltage (Vs). That is, in this example, if Vs is increased by 1 volt, Vd, Vg, and Vw are also increased by 1 volt.

During a read or access of erased semiconductor device 70 (i.e. semiconductor device 70 in a low Vt state) having halo region 46, an inversion layer is formed in channel region 86 and a depletion region (not shown) is formed around drain region 54 and drain extension 53. This depletion region substantially masks the dopant gradient created in halo region 46 thereby preventing the higher dopant of halo region 46 from increasing the Vt of semiconductor 70. In this manner, the Vt remains in a low Vt state, thus improving the read disturb by reducing Vt drift. Also, for the length of gate stack 32 being in a range of approximately 0.35 to 0.06 microns as was described above, a short channel leakage may result during programming of semiconductor device 70. However, highly doped APT region 74 also functions to reduce this short channel leakage, thereby reducing power consumption and improving programming efficiency.

Although the invention has been described with respect to specific conductivity types, skilled artisans appreciate that conductivity types may be reversed. For example, the source and drains and extensions may be p-type or n-type, depending on the polarity of the isolated well, in order to form either p-type or n-type semiconductor devices. Therefore, isolated well 20 may be an N-type well rather than a P-type well, and source and drain regions 52 and 54 and extensions 51 and 53 may be P-type. Also, in alternate embodiments, other materials and processing steps may be used to form semiconductor device 10; those described above have only been provided as examples.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory device, comprising:
   a semiconductor substrate;
   a well of a first conductivity type in the substrate;
   a channel region in the well extending from a surface of the well to a first depth having a first concentration of dopants of the first conductivity type and a second concentration of dopants of a second conductivity type;
   an APT region in the well extending from the first depth to a second depth below the first depth of the first conductivity type;
   a storage element over the channel region);
   a control gate over the storage element; and
   a third region and a fourth region in the well laterally adjacent to the control gate, wherein the third and fourth regions are of the second conductivity type.

2. The memory device of claim 1, wherein channel region is of the second conductivity type.

3. The memory device of claim 1, wherein the well has a net doping concentration that is greater than the first concentration minus the second concentration.

4. The memory device of claim 3, wherein the second concentration is larger than the first concentration.

5. The memory device of claim 3, wherein the first concentration minus the second concentration is a negative number having an absolute value greater than the net doping concentration of the well.

6. The memory device of claim 3, wherein the first concentration minus the second concentration is a negative number having an absolute value less than the net doping concentration of the well.

7. The memory device of claim 3, wherein the first concentration is larger than the second concentration.

8. The memory device of claim 1, wherein the storage element is a dielectric.

9. The memory device of claim 1, wherein the storage element comprises nitride.

10. The memory device of claim 1, further comprising a top dielectric between the control gate and the storage element and a bottom dielectric between the channel and the storage element.

11. The memory device of claim 1, wherein the storage element comprises nanocrystals in a dielectric.

12. The memory of claim 11, wherein the APT region has a net doping concentration, further comprising a heavily doped region in the well adjacent to the fourth doped region, wherein the heavily doped region is of the first conductivity type, has a portion between the APT region and the fourth doped region, and has a net doping concentration greater than the net doping concentration of the APT region.

13. A memory device comprising,
   a semiconductor substrate having a well of a first conductivity type;
   a channel region at a surface of the well having a first concentration of dopants of the first conductivity type and a second concentration of dopants of a second conductivity type;
   an APT region in the well of the first conductivity type disposed below the channel region;
   a storage element over the channel region;
   a control gate over the storage element;
   a source region in the well adjacent to a first side of the channel, the source region having the second conductivity type;
   a drain region in the well adjacent to a second side of the channel, the drain region having the second conductivity type; and
   a heavily doped region in the well disposed between the drain region and the APT region, the heavily doped region having the first conductivity type.

14. The memory device of claim 13, wherein the well has a net doping concentration that is greater than the first concentration minus the second concentration.

15. The memory device of claim 14, wherein the second concentration is larger than the first concentration.

16. The memory device of claim 14, wherein the first concentration minus the second concentration is a negative number having an absolute value greater than the net doping concentration of the well.

17. The memory device of claim 14, wherein the first concentration minus the second concentration is a negative number having an absolute value less than the net doping concentration of the well.

18. The memory device of claim 14, wherein the first concentration is larger than the second concentration.

19. The memory device of claim 13, wherein the heavily doped region has a first net doping concentration and the well has a second net doping concentration, wherein the first net doping concentration is greater than the second net doping concentration.

20. The memory device of claim 19, wherein the heavily doped region has a portion between the channel region and the drain region.

21. The memory device of claim 13, wherein the APT region has a higher net doping concentration than that of the well region.

* * * * *